United States Patent
Ishizaka

(10) Patent No.: US 6,646,775 B2
(45) Date of Patent: Nov. 11, 2003

(54) LIGHT SOURCE FOR INTEGRATING MODULATOR AND MODULE FOR OPTICAL COMMUNICATION

(75) Inventor: Masashige Ishizaka, Tokyo (JP)

(73) Assignee: NEC Corporation, Tokyo (JP)

( * ) Notice: Subject to any disclaimer, the term of this patent is extended or adjusted under 35 U.S.C. 154(b) by 211 days.

(21) Appl. No.: 09/850,115

(22) Filed: May 8, 2001

(65) Prior Publication Data

US 2001/0043384 A1 Nov. 22, 2001

(30) Foreign Application Priority Data

May 9, 2000 (JP) ....................... 2000-136137

(51) Int. Cl.[7] .............. G02F 1/03; G02F 1/07
(52) U.S. Cl. .............. 359/248; 359/247; 359/245
(58) Field of Search ................. 359/558, 563, 359/566, 569, 572, 573, 245, 248, 247, 260; 372/20, 32, 50, 96, 97

(56) References Cited

U.S. PATENT DOCUMENTS

| | | | | |
|---|---|---|---|---|
| 4,873,691 A | * | 10/1989 | Uomi et al. | ................... 372/20 |
| 2001/0005391 A1 | * | 6/2001 | Sakata | .......................... 372/43 |
| 2001/0019568 A1 | * | 9/2001 | Sakata | .......................... 372/50 |

OTHER PUBLICATIONS

M. Yamaguchi et al., "Requirements for Modular–Integrated DFB LD's for Penalty–Free 2.5–Gb/s Transmission", Journal of Lightwave Technology, vol. 13, No. 10, (Oct. 1995), pp. 1948–1954 with Abstract.

Y. Kotaki et al., "Analysis of Static and Dynamic Wavelength Shifts in Modulator Integrated DFB Lasers", Proceedings of the European Conference on Optical Communications, (Sep. 12, 1993), pp. 381–384 with Abstract.

O. Sahlen, "Optimization of DFB Lasers Integrated with Franz–Keldysh Absorption Modulators", Journal of Lightwave Technology, vol. 12, No. 6, (Jun. 1, 1994), pp. 969–976 with Abstract.

M. Aoki et al., New Transmission Simulation of EA–Modulator Integrated DFB–Lasers Considering the Facet Reflection–Induced Chirp, IEEE Phontonics Technology Letters, vol. 9, No. 3, (Mar. 1997), pp. 380–382 with Abstract.

J. Hashimoto et al., "Influence of Facet Reflection on the Performance of a DFB Laser Integrated with an Optical Amplifier/Modulator", IEEE Journal of Quantum Electronics, vol. 28, No. 3, (Mar. 1992), pp. 594–603 with Abstract.

* cited by examiner

Primary Examiner—Jordan M. Schwartz
Assistant Examiner—Jessica Shultz
(74) Attorney, Agent, or Firm—Sughrue Mion, PLLC

(57) ABSTRACT

An optical device including a substrate, a distributed feedback (DFB) semiconductor laser formed on the substrate and including a diffraction grating having an asymmetrical $\lambda/4$ phase shift region, the diffraction grating extending along an optical axis of the DFB semiconductor laser, and a field absorbing modulator integrated with the DFB semiconductor laser on the substrate for modulating a light wave emitted from the DFB semiconductor laser, the optical modulator having a facet reflection rate between 0.01 and 0.02% at an output end thereof, the diffraction grating having a $\kappa L$ value between 1 and 1.2. The proper combinations of the $\kappa L$ value of the diffraction grating and the reflection rate of the output facet of the modulator of the DFB semiconductor laser can fabricate the source for integrating the modulator having the excellent quality with a higher yield and lower cost.

8 Claims, 6 Drawing Sheets

LIGHT SOURCE FOR INTEGRATING MODULATOR AND MODULE FOR OPTICAL COMMUNICATION

BACKGROUND OF THE INVENTION (a) Field of the Invention

The present invention relates to a light source integrated with a modulator and a module for optical communication, and especially to the structure for the light source integrated with the modulator and suitable for a light source for long distance trunk used in wavelength division multiplexing (WDM).

(b) Description of the Related Art

As a light source for long distance trunk used in WDM, a module is put into practice which includes a distributed feedback semiconductor laser (DFB-LD) and a field absorbing modulator (MOD) on a single semiconductor substrate. This type of light source can realizes the transmission speed as high as 2.5 Gb/s and has been vigorously researched.

A resistance to distribution or an ability of transmitting long-distance signals in the DFB-LD is the most important parameter exhibiting element performance. The selection of products having no defect therein is currently conducted by measuring the resistance to distribution or the power penalty after the transmission of each element. It is an important subject to increase the yield of the selection for decreasing the cost of the light source.

Murotani et al. reported the dependency of the single mode yield of the DFB/MOD module having an asymmetrical $\lambda/4$ phase shifter (a structure obtained by moving the $\lambda/4$ phase shift region of the diffraction grating from the central position of the DFB-LD, hereinafter referred to as "asymmetrical $\lambda/4$-D-FB/MOD") on a $\kappa L$ value of a diffraction grating in the DFB-LD in the Electronics Society Meeting (C-4–15, p242) held in September 1999 by the Institute of Electronics, Information and Communication Engineers.

As shown in FIG. 1, the single mode yield rapidly decreases with the increase of the $\kappa L$ in the asymmetrical $\lambda/4$-DFB/MOD module. Conventional publications including the above publication describe neither the yield of the power source integrated with the modulator separately from the single mode yield, nor the optimum structure regarding determination of the facet reflection rate and of the $\kappa L$. The optimum structure has not been conventionally established by considering the dependency of the diffraction grating on the $\kappa L$ value and the dependency of the modulator on the facet reflection rate.

SUMMARY OF THE INVENTION

In view of the foregoing, an object of the present invention is to increase the yield of obtaining DFB/MOD module having no defect by considering the dependency of the $\kappa L$ value of the diffraction grating on the single mode yield and the transmission yield and the dependency of the modulator on the facet reflection rate.

The present invention provides an optical device including: a substrate; a distributed feedback (DFB) semiconductor laser formed on the substrate and including a diffraction grating having an asymmetrical $\lambda/4$ phase shift region, the diffraction grating extending along an optical axis of the DFB semiconductor laser; and a field absorbing modulator integrated with the DFB semiconductor laser on the substrate for modulating a light wave emitted from the DFB semiconductor laser, the modulator having a facet reflection rate between 0.01 and 0.02% at an output end thereof, the diffraction grating having a $\kappa L$ value between 1.4 and 1.7.

In another aspect of the present invention, the facet reflection rate of the output end of the modulator is in a range between 0.02 and 0.03%, and the $\kappa L$ value of the diffraction grating is between 1.2 and 1.3.

In a further aspect of the present invention, the facet reflection rate of the output end of the modulator is in a range between 0.03 and 0.05%, and the $\kappa L$ value of the diffraction grating is between 1.3 and 1–4.

In a still further aspect of the present invention, the facet reflection rate of the output end of the modulator is in a range between 0.05 and 0.1%, and the $\kappa L$ value of the diffraction grating is between 1.4 and 1.7.

In accordance with the present invention, the proper combinations of the $\kappa L$ value of the diffraction grating and the reflection rate of the output facet of the modulator of the DFB semiconductor laser can fabricate the source for integrating the modulator having the excellent quality with a higher yield and lower cost.

The above and other objects, features and advantages of the present invention will be more apparent from the following description.

PREFERRED EMBODIMENTS OF THE INVENTION

Figure 2:
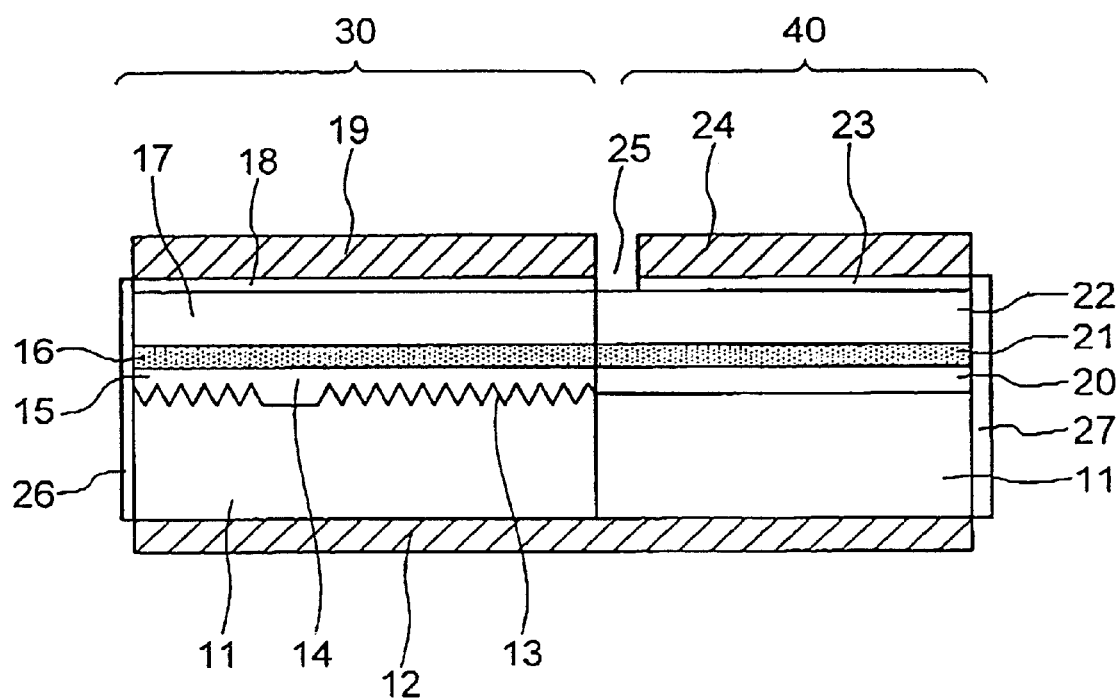
FIG. 2 is a vertical sectional view showing a source for integrating a modulator in accordance with a first embodiment of the present invention.

Then, the configuration of a light source, for integrating a modulator of a first embodiment will be described referring to FIG. 2.

As shown therein, a distributed feedback semiconductor laser (DFB-LD) 30 and a field absorbing modulator (MOD) 40 are integrated together on a single semiconductor substrate. A diffraction grating 13 having a space period of 2400 Å formed in a direction of progress of light and a flat phase shifting region 14 having a length of $\lambda g/4$ are formed on an n-InP substrate 11 by using, for example, an electron-beam exposure method or a chemical etching method. The phase shifting region 14 is disposed in the diffraction grating 13 such that the ratio between distances from the rear facet and the front facet (the emission end of the semiconductor laser) to the phase shifting region is 0.3–0.7. Then, an n-InGaAsP optical guide layer 15 having a wavelength of 1.15 μm, an undoped InGaAsP active layer 16 having a wavelength of 1.55 μm, a p-Inp cladding layer 17 and a p+-InGaAs cap layer 18 are sequentially and epitaxially grown. Further, an n-InGaAsP buffer layer 20, an undoped InGaAsP light-absorbing layer 21, a p-InP cladding layer 22, and a p+-InGaAs cap layer 23 are sequentially and epitaxially stacked onto the same n-InP substrate 11 by using a selective MOVPE (Metal Organic Vapor Phase Epitaxy) method or a pad joint method.

Then, a trench 25 is formed by using an ordinal etching method for electrically isolating the modulator 40 and the DFB laser 30. An n-type electrode 12 and p-type electrodes 14 and 19 are formed on the multi-layered semiconductor obtained in this manner. Finally, an AR (anti-reflection) coat film 27 is formed on the facet of the modulator 40, and an HR (higher reflection) coat film 26 is formed on the facet of the DFB-LD 30, thereby providing the configuration of the light source integrated with the modulator of the embodiment. The reflection rate of the light-emitting facet of the modulator 40 (optical power reflection rate) is 0.01%, and the κL value of the diffraction grating 13 of the DFB laser 30 is established between 1 and 1.2, wherein "κ" is a mode coupling constant, and "L" is cavity length of the DFB laser.

Figure 3:
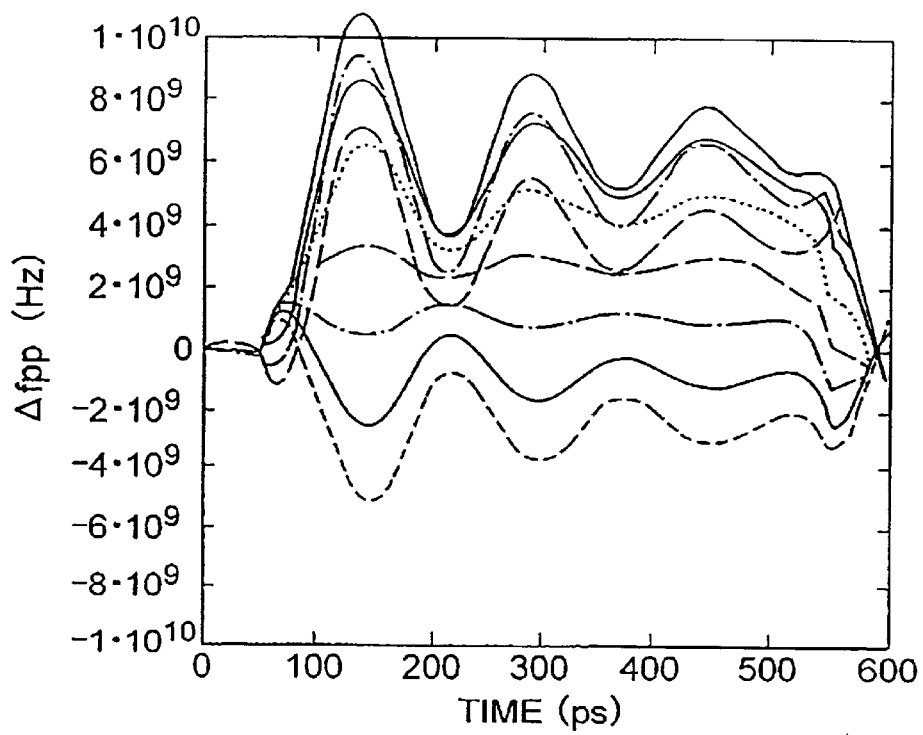
FIG. 3 is a graph showing chirping wave-shapes which change depending on each of the combinations of both the facets of the source for integrating the modulator of FIG. 2.
Figure 4:
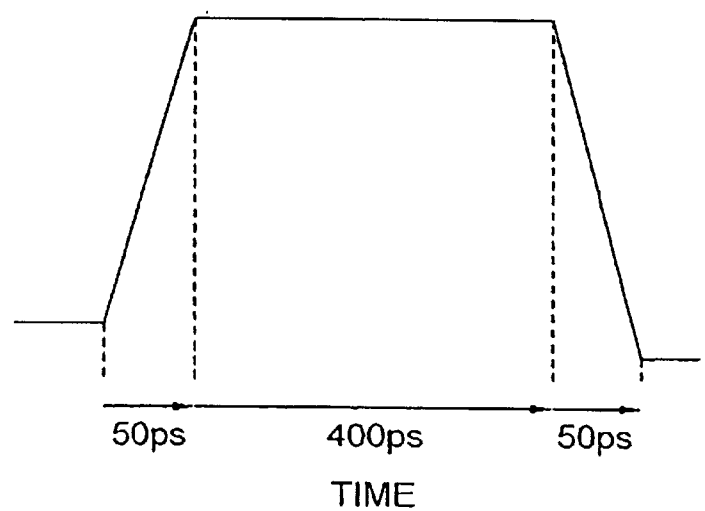
FIG. 4 is a wave-shape diagram of a signal voltage applied to the modulator during measurement of the chirping.

Under the condition of continuously emitting light by the semiconductor laser at an operation current of 70 mA, a pulse voltage shown in FIG. 4 was applied between the electrodes 23 and 12 of the modulator 40 to obtain the simulated change of the laser emission frequencies (chirping) as shown in FIG. 3 by using a simulation A plurality of curves in FIG. 3 were formed depending on the combinations of the optical phases at both the facets of the light source integrated with the modulator. It can be seen from FIG. 3 that the change of the combination of the optical phases at both the ends significantly changes its chirping. However, the excellent chirping can be hardly obtained if the combination of the phases at both the ends is determined by simply selecting the cavity length of the semiconductor laser.

The chirping is a main factor dominating the transmission performance, and the degree of the chirping is changed depending on the combination of the facet phases. The combination of the front and rear facet phases differs from the combination of another element, and has randomness substantially uncontrollable. Among the facet phases randomly occurring, the ratio of the facet phases generating the chirping in a permitted range exhibits the transmission yield.

Figure 5:
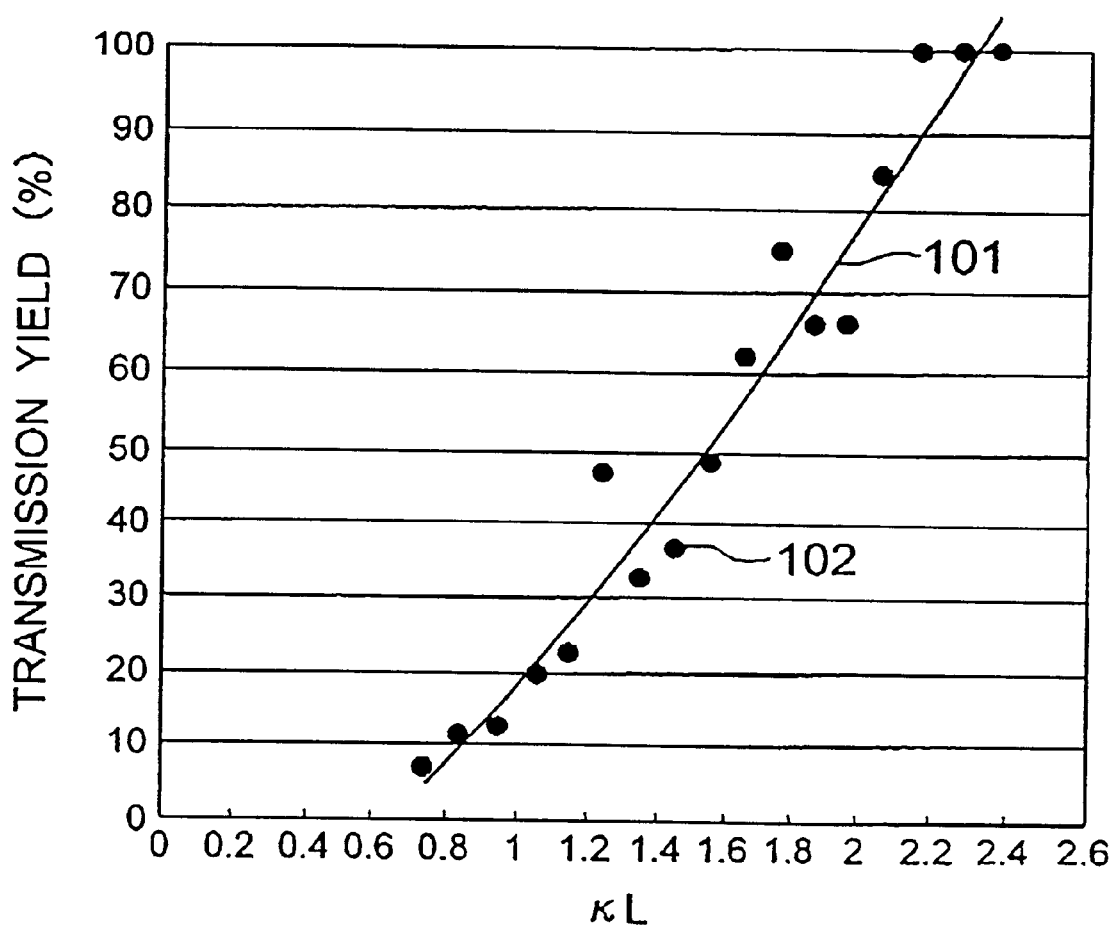
FIG. 5 is a graph showing a relation between a $\kappa L$ value of a diffraction grating and a transmission yield.
Figure 6:
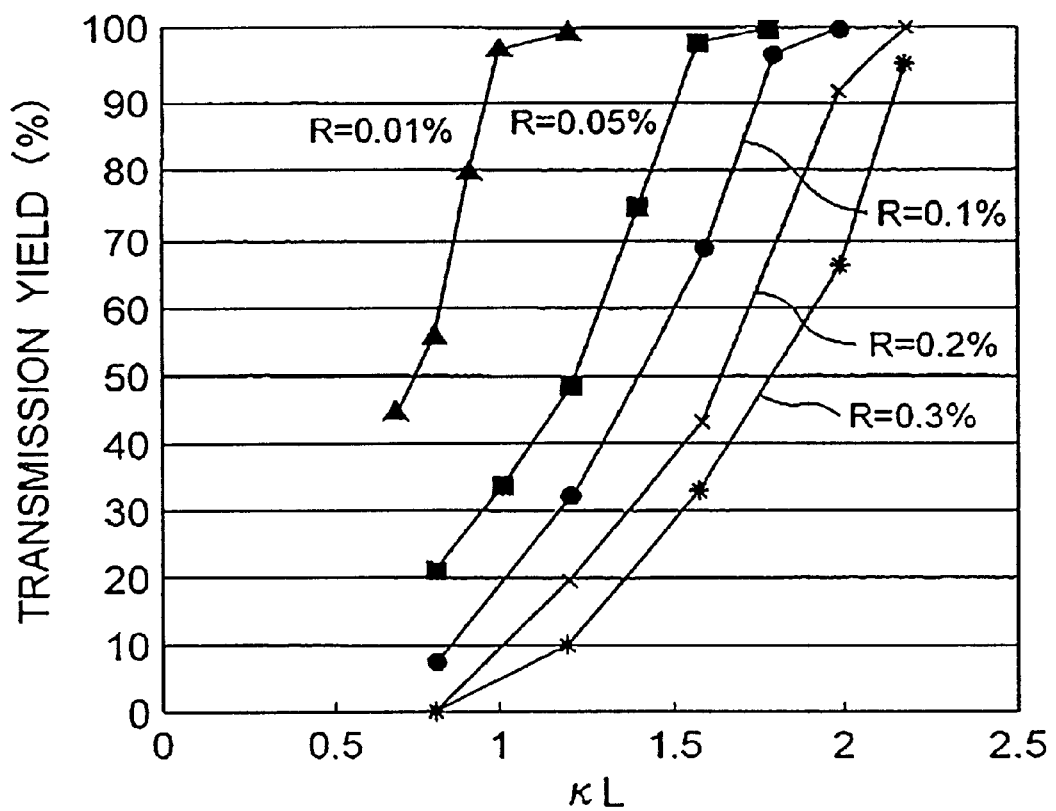
FIG. 6 is a graph showing a relation between the $\kappa L$ value of the diffraction grating and the transmission yield using, as a parameter, the reflection rate of the output facet of the modulator.

A graph of FIG. 5 shows the chirping from peak to peak (Δfpp), wherein simulated results (a curve 101 in the graph) of the transmission yields were obtained, and results by the actual measurement (dots 102 in the graph) were obtained under the situation that the product having the Δfpp 2.5 GHz was judged to be good quality. It can be seen from the graph of FIG. 5 that the simulated results and the actual results were in excellent agreement, and the transmission yield increased with the increase of the value of the diffraction grating. The results are illustrated in FIG. 6 which were obtained by the simulation and show the dependency of the transmission yield on the κL value and the reflection rate (R) of the modulator facet. As shown in the graph, the reduction of the reflection rate (R) increases the transmission yield.

Figure 1:
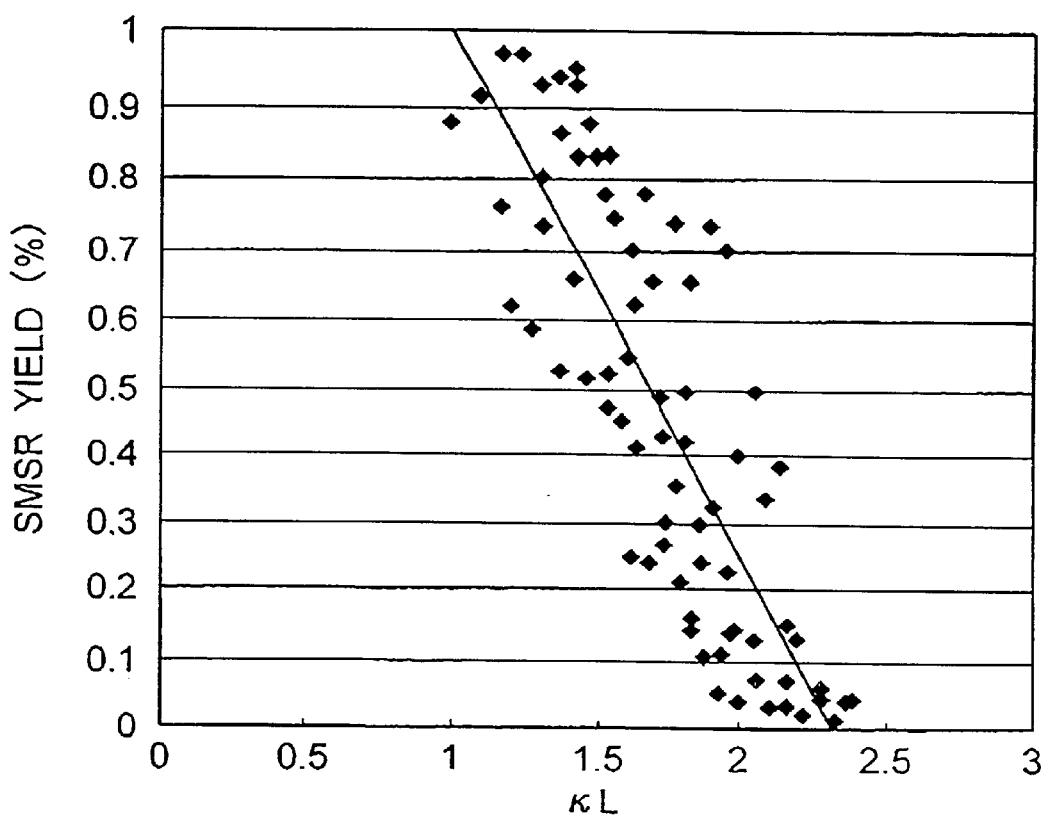
FIG. 1 is a graph showing a relation between a $\kappa L$ value of a diffraction grating and a single mode yield.

The dependency of the single mode yield which is another main factor of increasing the yield on the κL value was measure and summarized in FIG. 1.

Figure 7:
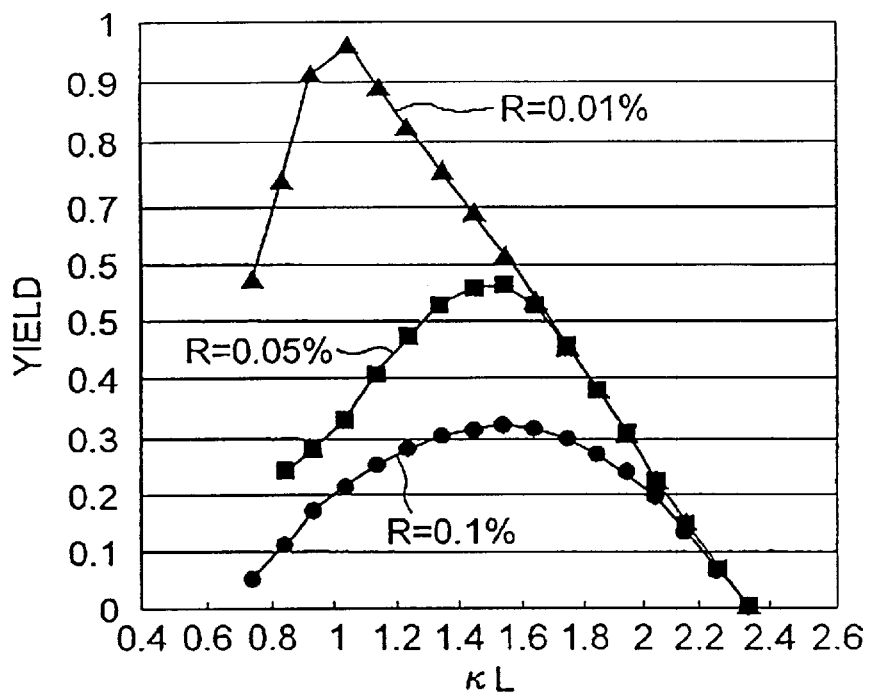
FIG. 7 is a graph showing a relation between the $\kappa L$ value of the diffraction grating and all the yield using, as a parameter, the reflection rate of the output facet of the modulator.

All the yield changes depending on the above two main factors are shown in FIG. 7, that is, the dependency of all the yields obtained by the single mode yield and the transmission yield on the κL value of the diffraction grating and the reflection rate of the modulator facet. Although only part of the reflection rates are shown in FIG. 7 for facilitating the understanding, other various curves corresponding to the remaining reflection rates were obtained based on the simulations shown in FIGS. 1 and 6 and actual measurements. It can be understood from FIGS. 6 and 7 that the proper selection of the κL value and the facet reflection rate can obtain the maximum yield. For example, the maximum yield can generally be obtained in the κL value range between 1 and 1.2 when the facet reflection rate (R) is 0.01%, and can be obtained in the κL value range between 1.4 and 1.7 when the facet reflection rate (R) is 0.1%.

The κL value range realizing the maximum yield of the integrated source was established with respect to each of the facet reflection rates of the modulator based on the combinations of the points obtained in FIGS. 1 and 6. The κL value range is between 1.0 and 1.2 when the reflection rate is between 0.01 and 0.02%, the κL value range is between 1.2 and 1.3 when the reflection rate is between 0.02 and 0.03%, the κL value range is between 1.3 and 1.4 when the reflection rate is between 0.03 and 0.05%, and the κL value range is between 1.4 and 1.7 when the reflection rate is between 0.05 and 0.1%. In this manner, the all the maximum yields of the integrated source can be obtained by the combinations of the proper κL value and the reflection rate.

Figure 8:
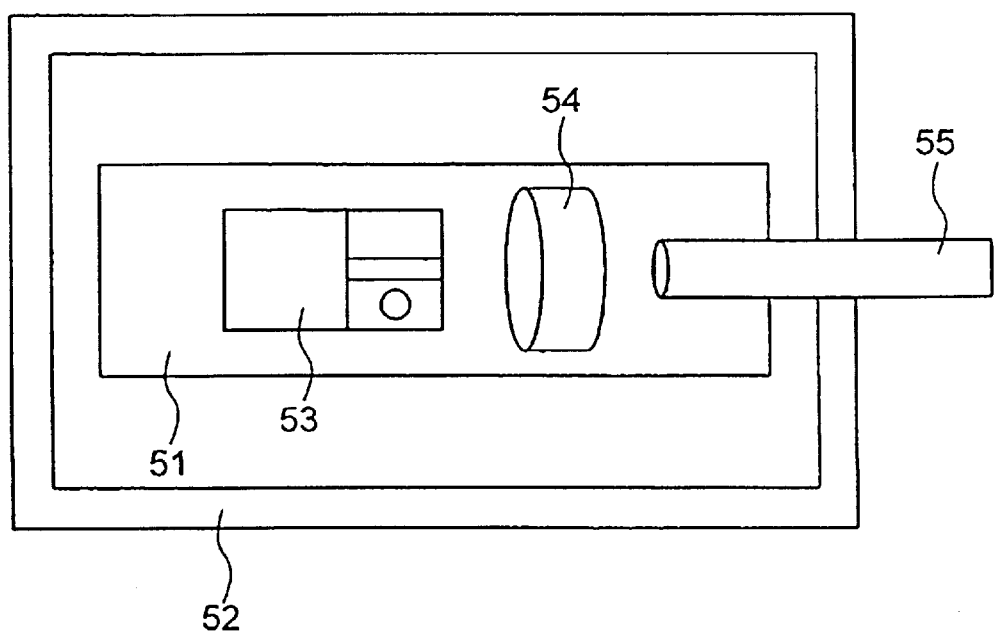
FIG. 8 is a top plan view showing a resonator module in accordance with a second embodiment of the present invention.

Then;, the configuration of a modulator module for optical communication of a second embodiment will be described referring to FIG. 8.

The modulator module 52 includes a photo-modulator 53 having substantially same configuration as that of the first embodiment and a non-spherical surface lens 54 jointly having a single optical axis with the photo-modulator 53 overlying a sub-mount 51. The light of the photo-modulator 53 is incident through the non-spherical surface lens 54 on an optical fiber 55 ahead of which is fixed to the end of the sub-mount 51. The modulator module 52 of the embodiment easily forms optical modulation signals with lower chirping.

Since the above embodiment is described only for examples, the present invention is not limited to the above embodiment and various modifications or alterations can be easily made therefrom by those skilled in the art without departing from the scope of the present invention.

What is claimed is:

1. An optical device comprising:
  a substrate;
  a distributed feedback (DFB) semiconductor laser formed on the substrate and including a diffraction grating having an asymmetrical λ/4 phase shift region, the diffraction grating extending along an optical axis of the DFB semiconductor laser; and
  a field absorbing modulator integrated with the DFB semiconductor laser on the substrate for modulating a light wave emitted from the DFB semiconductor laser, the field absorbing modulator having a facet reflection rate between 0.01 and 0.02% at an output end thereof, the diffraction grating having a κL value between 1 and 1.2, wherein κ is a mode coupling constant, and L s a cavity length of the DFB laser.

2. An optical modulator comprising a built-in light source, said built-in light source comprising:
  a distributed feedback (DFB semiconductor laser formed on the substrate and including a diffraction grating having an asymmetrical λ/4 phase shift region, the diffraction grating extending along an optical axis of the DFB semiconductor laser; and a field absorbing modulator integrated with the DFB semiconductor laser on the substrate for modulating a light wave emitted from the DFB semiconductor laser, the field absorbing modulator having a facet reflection rate between 0.01 and 0.02% at an output end thereof, the diffraction grating having a κL value between 1 and 1.2, wherein κ is a mode coupling constant, and L is a cavity length of the DFB laser.

3. An optical device comprising:

a substrate;

a distributed feedback (DFB semiconductor laser formed on the substrate and including a diffraction grating having an asymmetrical λ/4 phase shift region, the diffraction grating extending along an optical axis of the DFB semiconductor laser; and a field absorbing modulator integrated with the DFB semiconductor laser on the substrate for modulating a light wave emitted from the DFB semiconductor laser, the field absorbing modulator having a facet reflection rate between 0.02 and 0.03% at an output end thereof, the diffraction grating having a κL value between 1.2 and 1.3, wherein κ is a mode coupling constant, and L is a cavity length of the DFB laser.

4. An optical modulator comprising a built-in light source, said built-in light source comprising:

a substrate;

a distributed feedback (DFB) semiconductor laser formed on the substrate and including a diffraction grating having an asymmetrical λ/4 phase shift region, the diffraction grating extending along an optical axis of the DFB semiconductor laser; and a field absorbing modulator integrated with the DFB semiconductor laser on the substrate for modulating a light wave emitted from the DFB semiconductor laser, the field absorbing modulator having a facet reflection rate between 0.02 and 0.03% at an output end thereof, the diffraction grating having a κL value between 1.2 and 1.3, wherein κ is a mode coupling constant, and is a cavity length of the DFB laser.

5. An optical device comprising:

a substrate;

a distributed feedback (DFB semiconductor laser formed on the substrate and including a diffraction grating having an asymmetrical λ/4 phase shift region, the diffraction grating extending along an optical axis of the DFB semiconductor laser; and a field absorbing modulator integrated with the DFB semiconductor laser on the substrate for modulating a light wave emitted from the DFB semiconductor laser, the field absorbing modulator having a facet reflection rate between 0.03 and 0.05% at an output end thereof, the diffraction grating having a κL value between 1.3 and 1.4, wherein κ is a mode coupling constant, and L is a cavity length of the DFB laser.

6. An optical modulator comprising a built-in light source, said built-in light source comprising:

a substrate;

a distributed feedback (DFB) semiconductor laser formed on the substrate and including a diffraction grating having an asymmetrical λ/4 phase shift region, the diffraction grating extending along an optical axis of the DFB semiconductor laser; and a field absorbing modulator integrated with the DFB semiconductor laser on the substrate for modulating a light wave emitted from the DFB semiconductor laser, the field absorbing modulator having a facet reflection rate between 0.03 and 0.05% at an output end thereof, the diffraction grating having a κL value between 1.3 and 1.4, wherein κ is a mode coupling constant, and L is a cavity length of the DFB laser.

7. An optical device comprising:

a substrate;

a distributed feedback (DFB) semiconductor laser formed on the substrate and including a diffraction grating having an asymmetrical λ/4 phase shift region, the diffraction grating extending along an optical axis of the DFB semiconductor laser; and a field absorbing modulator integrated with the DFB semiconductor laser on the substrate for modulating a light wave emitted from the DFB semiconductor laser, the field absorbing modulator having a facet reflection rate between 0.05 and 0.1% at an output end thereof, the diffraction rating having a κL value between 1.4 and 1.7, wherein κ is a mode coupling constant, and L is a cavity length of the DFB laser.

8. An optical modulator comprising a built-in light source, said built-in light source comprising:

a substrate;

a distributed feedback (DFB) semiconductor laser formed on the substrate and including a diffraction grating having an asymmetrical λ/4 phase shift region, the diffraction grating extending along an optical axis of the DFB semiconductor laser; and a field absorbing modulator integrated with the DFB semiconductor laser on the substrate for modulating a light wave emitted from the DFB semiconductor laser, the field absorbing modulator having a facet reflection rate between 0.05 and 0.1% at an output end thereof, the diffraction rating having a κL value between 1.4 and 1.7, wherein κ is a mode coupling constant, and L is a cavity length of the DFB laser.

* * * * *